(12) United States Patent
Pawlowski

(10) Patent No.: US 11,461,017 B2
(45) Date of Patent: Oct. 4, 2022

(54) SYSTEMS AND METHODS FOR IMPROVING EFFICIENCIES OF A MEMORY SYSTEM

(71) Applicant: MICRON TECHNOLOGY, INC., Boise, ID (US)

(72) Inventor: J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 16/747,336

(22) Filed: Jan. 20, 2020

(65) Prior Publication Data
US 2020/0150884 A1 May 14, 2020

Related U.S. Application Data

(60) Division of application No. 15/637,327, filed on Jun. 29, 2017, now Pat. No. 10,572,164, which is a
(Continued)

(51) Int. Cl.
*G06F 3/06* (2006.01)
*G06F 13/16* (2006.01)
(Continued)

(52) U.S. Cl.
CPC ............ *G06F 3/0619* (2013.01); *G06F 3/061* (2013.01); *G06F 3/0604* (2013.01);
(Continued)

(58) Field of Classification Search
CPC .... G06F 3/0619; G06F 3/0617; G06F 3/0656; G06F 11/10; G06F 3/0611; G06F 3/0683;
(Continued)

(56) References Cited

U.S. PATENT DOCUMENTS 5,771,247 A * 6/1998 Allen .................. G06F 11/1044
714/763
6,218,199 B1 4/2001 Sato
(Continued)

FOREIGN PATENT DOCUMENTS

CN 1501258 A 6/2004
CN 102138297 A 7/2011
(Continued)

OTHER PUBLICATIONS

Chinese Office Action dated May 5, 2022 for Application No. 201910363451.4, 18 pgs.

*Primary Examiner* — James C Kerveros
(74) *Attorney, Agent, or Firm* — Fletcher Yoder, P.C.

(57) ABSTRACT

A memory device includes a memory component that stores data. The memory device also includes a processor that receives a signal indicating that the memory component is coupled to the processor and retrieves information from the memory component. The information may include one or more algorithms capable of being performed by the memory component. The processor may then receive one or more packets associated with one or more data operations regarding the memory component. The processor may then perform the one or more data operations by using the memory component to employ the one or more algorithms.

20 Claims, 4 Drawing Sheets

Related U.S. Application Data continuation of application No. 14/724,558, filed on May 28, 2015, now Pat. No. 9,696,920.

(60) Provisional application No. 62/006,668, filed on Jun. 2, 2014.

(51) Int. Cl.
| | |
|---|---|
| *G06F 11/10* | (2006.01) |
| *G06F 13/38* | (2006.01) |
| *G06F 11/07* | (2006.01) |
| *G11C 29/52* | (2006.01) |
| *H04L 1/18* | (2006.01) |
| *H04L 47/12* | (2022.01) |
| *H04L 47/25* | (2022.01) |
| *H04L 47/52* | (2022.01) |

(52) U.S. Cl.
CPC .......... *G06F 3/0611* (2013.01); *G06F 3/0617* (2013.01); *G06F 3/0644* (2013.01); *G06F 3/0655* (2013.01); *G06F 3/0656* (2013.01); *G06F 3/0659* (2013.01); *G06F 3/0673* (2013.01); *G06F 3/0679* (2013.01); *G06F 3/0683* (2013.01); *G06F 3/0685* (2013.01); *G06F 3/0688* (2013.01); *G06F 11/07* (2013.01); *G06F 11/073* (2013.01); *G06F 11/076* (2013.01); *G06F 11/0727* (2013.01); *G06F 11/10* (2013.01); *G06F 11/1016* (2013.01); *G06F 11/1044* (2013.01); *G06F 11/1068* (2013.01); *G06F 11/1072* (2013.01); *G06F 13/16* (2013.01); *G06F 13/38* (2013.01); *G11C 29/52* (2013.01); *H04L 1/189* (2013.01); *H04L 47/12* (2013.01); *H04L 47/25* (2013.01); *H04L 47/52* (2013.01); *Y02D 10/00* (2018.01)

(58) Field of Classification Search
CPC .... G06F 11/07; G06F 11/0727; G06F 11/073; G06F 3/0679; G06F 13/16; G06F 3/0604; G06F 3/0644; G06F 3/0655; G06F 3/0685; G06F 3/0688; G06F 11/076; G06F 11/1016; G06F 11/1044; G06F 11/1068; G06F 11/1072; G06F 13/38; G06F 3/061; G06F 3/0659; G06F 3/0673; G06F 3/0661; G11C 29/52; H04L 1/189; H04L 47/12; H04L 47/25; H04L 47/52; Y02D 10/00

USPC .......................................................... 714/764
See application file for complete search history.

(56) References Cited

U.S. PATENT DOCUMENTS

| | | | |
|---|---|---|---|
| 6,601,211 B1 | 7/2003 | Norman | |
| 8,281,065 B2 | 10/2012 | Byom et al. | |
| 8,281,218 B1 | 10/2012 | Ybarra et al. | |
| 8,347,183 B2 | 1/2013 | Yoon et al. | |
| 8,713,311 B1 | 4/2014 | Roskind | |
| 8,938,658 B2 | 1/2015 | Tai et al. | |
| 8,966,191 B2 * | 2/2015 | Flynn | G06F 3/0643 711/154 |
| 9,030,771 B2 | 5/2015 | Hostetter | |
| 9,048,876 B2 | 6/2015 | Frayer et al. | |
| 9,552,210 B2 | 1/2017 | Woo et al. | |
| 2002/0154633 A1 | 10/2002 | Shin et al. | |
| 2002/0191603 A1 | 12/2002 | Shin et al. | |
| 2003/0177303 A1 | 9/2003 | Langendorf | |
| 2005/0057973 A1 | 3/2005 | Khatami et al. | |
| 2007/0055817 A1 | 3/2007 | Jeddeloh | |
| 2007/0156946 A1 | 7/2007 | Lakshmanamurthy et al. | |
| 2008/0112222 A1 | 5/2008 | Shirakawa | |
| 2008/0184002 A1 | 7/2008 | Lee | |
| 2009/0063916 A1 | 3/2009 | Vogelsang | |
| 2009/0287891 A1 | 11/2009 | Nakano | |
| 2011/0093662 A1 | 4/2011 | Walker et al. | |
| 2011/0093665 A1 | 4/2011 | Walker et al. | |
| 2011/0320668 A1 * | 12/2011 | Liu | H04L 12/2898 710/301 |
| 2012/0005558 A1 | 1/2012 | Steiner et al. | |
| 2013/0073931 A1 * | 3/2013 | Sindhu | H04L 1/0052 714/807 |
| 2013/0195210 A1 | 8/2013 | Swarbrick et al. | |
| 2013/0205183 A1 * | 8/2013 | Fillingim | H03M 13/353 714/773 |
| 2016/0116972 A1 | 4/2016 | Shin et al. | |
| 2019/0146695 A1 | 5/2019 | Kim et al. | |

FOREIGN PATENT DOCUMENTS

| | | |
|---|---|---|
| CN | 102469277 A | 5/2012 |
| EP | 2447842 A1 | 5/2012 |
| WO | 02091382 A2 | 11/2002 |
| WO | 2011071645 A1 | 6/2011 |

* cited by examiner

SYSTEMS AND METHODS FOR IMPROVING EFFICIENCIES OF A MEMORY SYSTEM

CROSS-REFERENCE TO RELATED APPLICATION

This application is a Divisional of U.S. patent application Ser. No. 15/637,327, filed on Jun. 29, 2017, which is a Continuation of U.S. patent application Ser. No. 14/724,558, filed on May 28, 2015, which is a Non-Provisional Application claiming priority to U.S. Provisional Patent Application No. 62/006,668, entitled "Systems and Methods for a Scalable Memory System Protocol," filed Jun. 2, 2014. Each of these applications are herein incorporated by reference. This application is also related to U.S. patent application Ser. No. 14/724,446, entitled "Systems and Methods for Transmitting Packets in a Scalable Memory System Protocol," filed May 28, 2015, which is also herein incorporated by reference.

BACKGROUND

1. Field of the Invention

The present disclosure is generally related to a memory system protocol used for performing data operations (e.g., read, write) using memory devices. More specifically, the present disclosure is related to a packet-based scalable protocol that enables a number of memory and processing combinations, provides bit-efficient data transfer operations, and is concordant with a variety of bus types (e.g., electrical, optical).

2. Description of the Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Conventional protocols generally transmit packets between memory devices with relatively low failure rates as compared with their predecessors. However, as industries aim to minimize the amount of energy involved in moving packets of data between memory devices and other components, it is desirable to use protocols that efficiently move packets of data using a minimal amount of energy, while maintaining the integrity of the packet transmission.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

Figure 1:
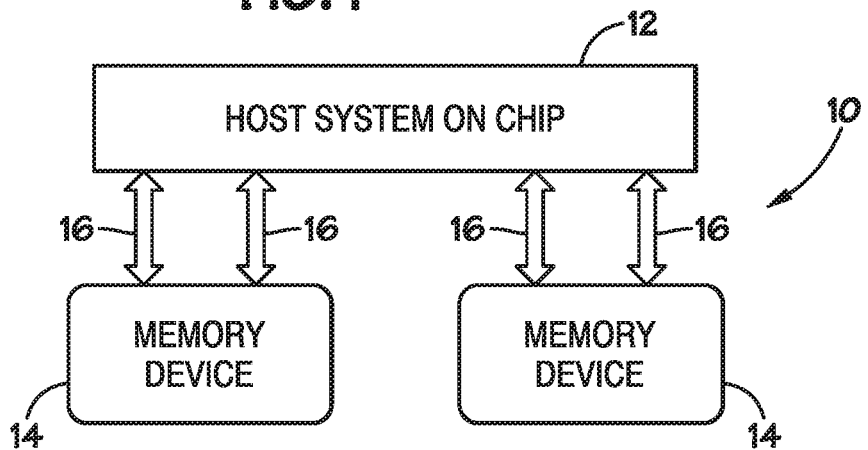
FIG. 1 illustrates a block diagram of an example of a computing system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Scalable Memory System Protocol

As will be discussed in detail below, the present disclosure generally relates to scalable memory system protocol. That is, the scalable memory system protocol may adjust certain operations based on characteristics of the data packets (e.g., requests, responses) being transferred. In one embodiment, the scalable memory system protocol ("scalable protocol") may be a packet-based protocol that enables an efficient (e.g., power efficient, bit efficient) transmittal of packets of data between memory devices, computing devices, and the like. The scalable protocol may be implemented in a number of combinations with various types of memory and processors such as Automata processors, a Processor-in-Memory, network devices, storage appliances, hierarchical memory, abstracted memory, and the like. As used herein, processors may include any suitable processor capable of performing executable instructions on a corresponding electrical device. The scalable protocol may also facilitate a broad range of devices including data center switches/routers, network routers, mobile devices, storage devices, Automata processors, Stream processors, processor-in-memory, work-moving-processors, Big Data, Big Graph, secure memory, virtual network, general abstracted memory (e.g., Dynamic Random-Access Memory (DRAM), NAND, and emerging memories), and the like.

In certain embodiments, the scalable protocol may be designed to facilitate communication of data packets between various memory and processing components while maintaining a lowest reasonable scalable protocol overhead. In other words, the scalable protocol may be designed to provide a bit efficient transfer of data packets in that most, if not all, bits transferred via the scalable protocol are directly part of a corresponding data packet being transmitted. For instance, as will be discussed in more detail below, the scalable protocol may enable request packets to be packed together without padding a signal with zeros unrelated to the respective packets, thereby maximizing a bit efficiency of data packets being transferred via transmission lanes of a bus.

In addition to providing a bit-efficient mechanism to transfer data packets, the scalable protocol may be concordant with a number of bus types, such as electrical or optical buses. Moreover, the scalable protocol may be capable of providing various operations with regard to the respective bus including encoding, lane counting, channel counting, speed, style, instantiation count of a system, and the like.

Scalable Protocol

Keeping the foregoing in mind, the scalable protocol may be optimized to provide for successful transactions such that packet failures are rare (e.g., <1e−6). The scalable protocol may also provide a careful tradeoff between packet transmission types, sizes, and a number of different packet sizes that may be handled.

As discussed above, industries are more focused on minimizing data movement energy. That is, the energy consumed or spent moving data packets between memory devices should be minimized. As such, the scalable protocol may, within reason, eliminate certain bits and messages that may be discerned from other bits or messages or may otherwise be unnecessary. For example, the scalable protocol may obviate the need for a device to transmit data related to information that may already be known to the receiver.

Moreover, to provide efficient data movement operations, the scalable protocol may facilitate transactions that are "sent to the memory." The scalable protocol may also transfer local operations, where internal data flow is relatively low as compared to external control operations, with the external control operations. Furthermore, the scalable protocol may implement an error control strategy that minimizes overhead using a dynamic field size that adjusts or changes based on the amount of data (e.g., payload) being transmitted in the respective packet.

The scalable protocol may also minimize a number of fields used to convey data. As such, the scalable protocol may allow field size tuning and flexibility since every packet may not make use of all available fields.

The scalable protocol may also be designed to facilitate the coexistence of low-latency and high-latency data. For example, the scalable protocol may provide the ability to interlace the transmittal of low-latency data between the transmittal high-latency data.

The design of the scalable protocol may be characterized as simple and generic in that the variable packet size may be determined in a single field of the respective packet. Further, the scalable protocol may maintain simplicity in terms of its operations while remaining capable of performing complex transactions and operations. In addition, the scalable protocol may be flexible enough to enable future functions that it may not currently be designed to provide.

In certain embodiments, the scalable protocol may limit the order in which packets are sent using local ordering schemes. That is, the scalable protocol may not enforce certain global synchronization ordering rules or the like. To stay true to the notion that the scalable protocol remains abstract, the scalable protocol may facilitate operations with a special device or with different types of channel properties.

Keeping the foregoing in mind, the present disclosure describes a number of systems and techniques that may be implemented within the scalable protocol to provide for the aforementioned advantages. Although certain systems or techniques detailed below are described independently with respect to other systems or techniques, it should be noted that each of the systems and techniques described herein may be implemented with various other systems and techniques also described herein.

Computing and Memory Systems Using the Scalable Protocol

Turning now to the drawings, FIG. 1 illustrates a block diagram of a computing system 10 that may employ various techniques and systems described herein. The computing system 10 may be any of a variety of computing devices, such as a computer, pager, cellular phone, personal organizer, control circuit, etc. The computing system 10 may include a host system on chip (SoC) 12 that may be coupled to a number of memory devices 14. The host SoC 12 may be an integrated circuit (IC) that integrates all components of a computer or other electronic system into a single chip. As such, the host SoC 12 may include one or more processors, such as a microprocessor, that may control the processing of system functions and requests in the computing system 10. In certain embodiments, the host SoC 12 may be a requesting component that requests data operations to be performed by another processor.

As mentioned above, the host SoC 12 may be coupled to the memory devices 14. In certain embodiments, the host SoC 12 may be coupled to the memory devices 14 via channels 16. The channels 16 may include buses, electrical wiring, or the like.

Figure 2:
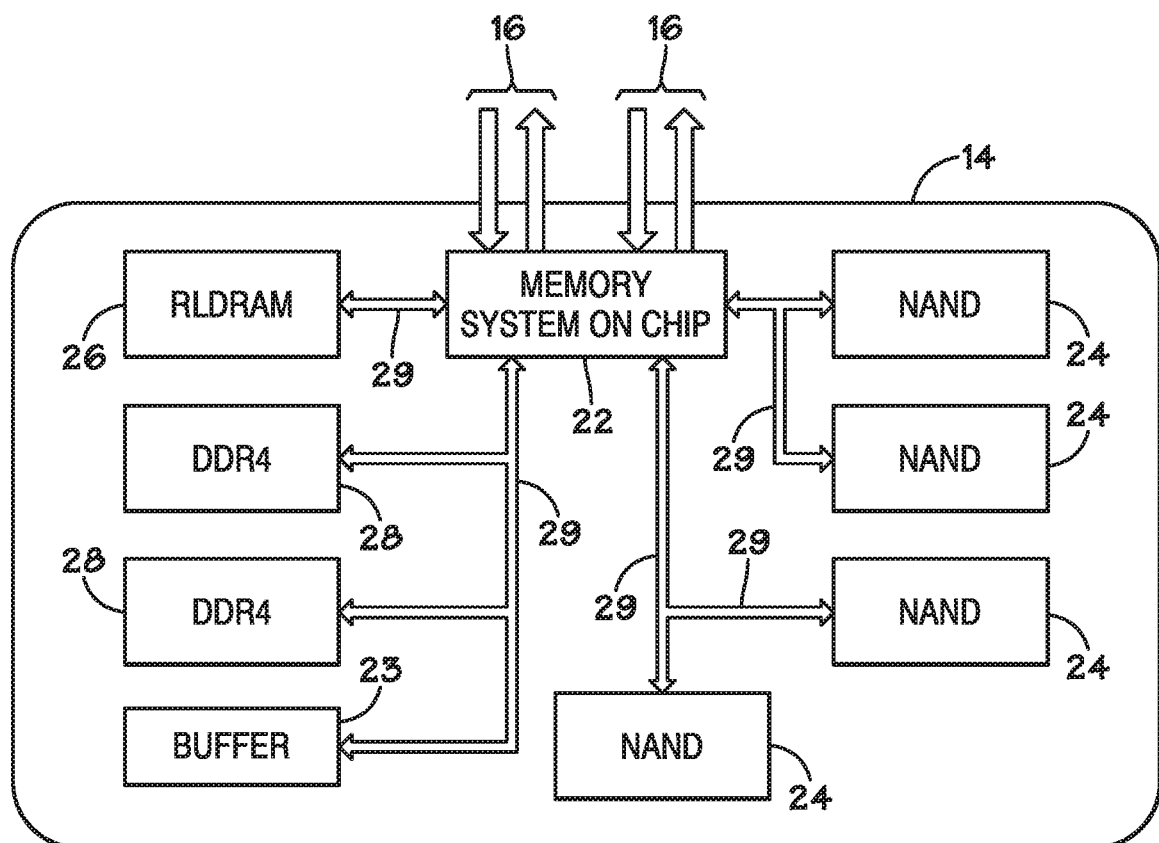
FIG. 2 illustrates a block diagram of an example of a memory device, which may be part of the computing system of FIG. 1, in accordance with an embodiment.

FIG. 2 depicts a block diagram of an embodiment of the memory device 14. The memory device 14 may include any storage device designed to retain digital data. The memory device 14 may encompass a wide variety of memory components including volatile memory and non-volatile memory. Volatile memory may include Dynamic Random Access Memory (DRAM) and/or Static Random Access Memory (SRAM).

Moreover, the volatile memory may include a number of memory modules, such as single inline memory modules (SIMMs) or dual inline memory modules (DIMMs).

The non-volatile memory may include a read-only memory (ROM), such as an EPROM, and/or flash memory (e.g., NAND) to be used in conjunction with the volatile memory. Additionally, the non-volatile memory may include a high capacity memory such as a tape or disk drive memory. As will be appreciated, the volatile memory or the non-volatile memory may be considered a non-transitory tangible machine-readable medium for storing code (e.g., instructions).

As shown in FIG. 2, in certain embodiments, the memory device 14 may include a system on chip (SoC) 22 that may be any suitable processor, such as a processor-in-memory (PIM) or a computer processor (CPU) tightly coupled to the memory components stored on the memory device 14. Generally, the memory SoC 22 may be on the same silicon chip as the memory components of the memory device 14. By merging the processing and memory components into the memory device 14, the memory SoC 22 may manage the manner in which data requests and responses are transmitted and received between the memory components and the host SoC 12. In certain embodiments, the memory SoC 22 may control the traffic between the memory components to reduce latency and increase bandwidth. As will be appreciated, the host SoC 12 and the memory SoC 22 may employ a scalable memory system protocol when controlling the transmissions between memory components and other devices in accordance with embodiments described herein. As such, the scalable memory system protocol may be operating on the channels 16 between the memory device 14 and the host SoC 12, as well as on channels 29 between the memory components and the memory SoC 22.

In certain embodiments, the memory device 14 may also include a buffer 23. The buffer 23 may store one or more packets received by the memory SoC 22. By way of example, the memory device 14 may include memory types such as NAND memories 24, Reduced-latency Dynamic random access memory (RLDRAM) 26, double data rate fourth generation synchronous dynamic random-access memory (DDR4) 28, and the like.

In certain embodiments, the host SoC 12 and the memory SoC 22 may perform various operations based on computer-executable instructions provided via memory components, registers, and the like. The memory components or storage may be any suitable articles of manufacture that can serve as media to store processor-executable code, data, or the like. These articles of manufacture may represent computer-readable media (i.e., any suitable form of memory or storage) that may store the processor-executable code used by the host SoC 12 or the memory SoC 22 to perform the presently disclosed techniques. The memory and the storage may also be used to store the data, analysis of the data, and the like. The memory and the storage may represent non-transitory computer-readable media (i.e., any suitable form of memory or storage) that may store the processor-executable code used by the host SoC 12 or the memory SoC 22 to perform various techniques described herein. It should be noted that non-transitory merely indicates that the media is tangible and not a signal.

Although the following description of various aspects related to the scalable protocol is described herein as being performed with respect to the host SoC 12 and the memory SoC 22, it should be noted that all of the systems and techniques described herein may be performed using any suitable device. That is, the scalable protocol may facilitate communication between any two devices, such as communications between two processors, two memory modules, a processor and a memory module, and the like.

Packet-Level View of Packets in Scalable Protocol

Figure 3:
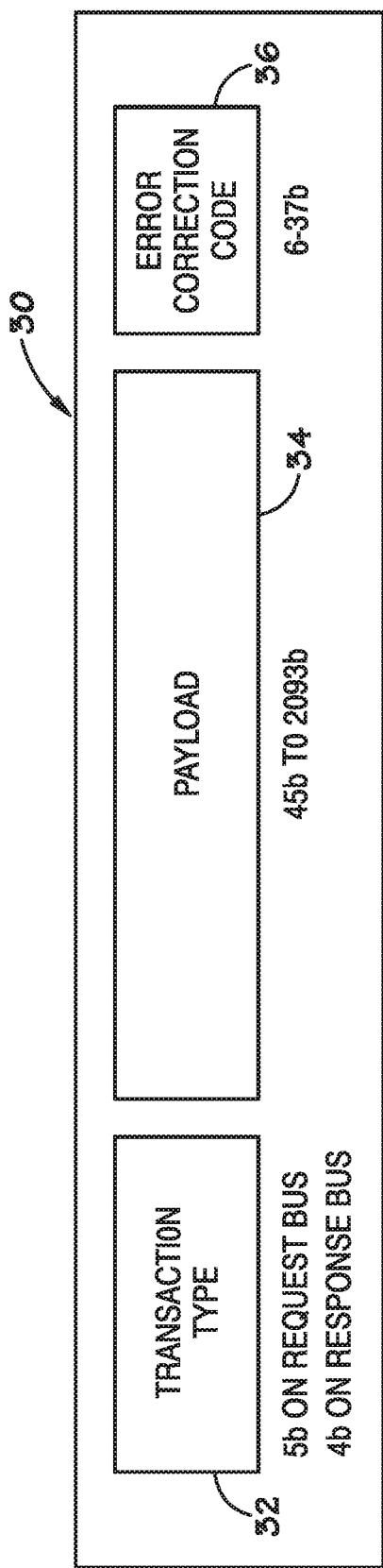
FIG. 3 illustrates a packet level view of a packet that may be transmitted within the computing system of FIG. 1, in accordance with an embodiment.

To employ the scalable memory system protocol when transmitting requests and responses involving the memory components, the memory SoC 22 may send packets of data structured according to a packet level view of a packet 30 illustrated in FIG. 3. As shown in FIG. 3, the packet 30 may include a transaction type field 32, a payload field 34, and an error control code (ECC) field 36. The transaction type field 32 may include data indicative of the type of transmittance, a type of packet being transmitted, or both. The transaction type field 32 may also indicate a packet size to indicate a number of bits in the data payload and the number of bits in the ECC field, thereby indicating the number of bits in the entire packet. In certain embodiments, the transaction type field 32 may indicate the size of the payload field 34 and the ECC field 36 in an indirect manner. For example, the data stored in the transaction type field 32 may serve as an index to a lookup table. The lookup table may provide information regarding the sizes of the payload field 34 and the ECC field 36. As such, the memory SoC 22 may, in one example, receive the packet 30 and use the data stored in the transaction type field 32 as an index to a lookup table that may be stored within the memory device 14 to determine the sizes of the payload field 34 and the ECC field 36.

In certain embodiments, the transaction type field 32 may specify different types of packets based on whether the packet is being transmitted on a request bus Q or a response bus S, which may include the channels 16, the channels 29, or the like. Generally, the request bus Q and the response bus S may be separate, unidirectional, or common inputs/outputs. The request bus Q generally includes q lanes, and the response bus S generally includes s lanes.

Example transaction type fields 32 for packets 30 transmitted on the request bus Q may include read operations (e.g., 8uRead, 8uRead2, varRead, where u might be an 8-bit unit or a 9-bit unit or possibly a non-integer unit size of data), message data (e.g., message), read-modify-write (RMW) operations (e.g., RMW1A, RMW2A, RMW3A, RMW4A), datasets (e.g., 32uData, 64uData, 128uData, 256uData), pattern write operations (e.g., 8uPatternWrite, 16uPatternWrite), write-with-enable operations (e.g., 8uWriteWithEnables, 16uWriteWithEnables), write operations (e.g., 8uWrite, 16uWrite, 32Write, 48uWrite, 64Write, 80uWrite, 96uWrite, 112uWrite, 128Write, 256Write), and the like. Providing 32Write operations and 64Write operations may provide more flexibility to a system designer in picking a maximum packet size. The scalable protocol may, in one embodiment, have a limit of 256Unit, but using a smaller maximum packet size may help with system latency. It should be understood that the difference between 32uWrite and 32Write is that 32uWrite is a single fixed size and the TransactionSize is not included in the packet. On the other hand, 32Write includes a TransactionSize and thus can involve additional 32 U chunks of data, not just the 32 U chunk included in the original request packet. Noting the listed transaction type examples above for the request bus Q, the packets 30 transmitted via the request bus Q may include a total of 26 native transactions (e.g., 8uRead, message, RMW1A, etc.), each of which may be represented using a 5-bit field for global (i.e., system that includes numerous CPU modules and/or numerous memory device modules in which packets may be relayed from unit to unit) or local systems (i.e., system that include few modules in which packets move point to point between units without relaying). As such, in one embodiment, the transaction type field 32 for a packet 30 on the request bus Q may be 5 bits.

In the same manner, example transaction type fields 32 for packets 30 transmitted on the response bus S may include message data (e.g., message), datasets (e.g., 8uData, 16uData, 32uData, 48uData, 64uData, 80uData, 96uData, 112uData, 128uData, 256uData), and the like. Again, noting the listed transaction type examples above for the response bus S, the packets 30 transmitted via the response bus S may include a total of 11 native transactions (e.g., message, 8uData, etc.), each of which may be represented using a 4-bit or 5-bit field for a local system. As such, in one embodiment, the transaction type field 32 for a packet 30 on the response bus S may be 4 bits.

Since the 26 request bus Q transaction types and the 11 response bus S transaction types include 5 of the same transaction types (e.g., message, 128uData, 256uData), the total number of transaction types used by the request bus Q and the response bus S may be 32. These 32 transaction types may thus be represented in a 5-bit field. Additional details regarding the transaction types will be discussed further below.

Referring again to FIG. 3, the packet 30 may also include a payload field 34 and an error control code (ECC) field 36. As mentioned above, the respective size of the payload field 34 and the ECC field 36 may be determined based on the data in the transaction type field 32. By way of examples, the payload field 34 may be approximately between 45 bits and 2093 bits, and the ECC field 36 may be approximately between 6 bits and 37 bits. The payload field 34 may include the data representative of the request or response being sent via the request or response bus, respectively.

The ECC field 36 may include the error control code to determine whether the packet 30 received by the receiving component includes any errors. As such, the error control code may include various algorithms, such as adding redundant data, or parity data, to a message, such that the original data may be recovered by the receiving component even when a number of errors were introduced, either during the process of transmission, or on storage. Generally, the error control code may provide the ability to detect an error within the limits of the code and indicate a further action, such as retransmitting the errant packet, when the error is detected.

Transaction Windows

In addition to providing improved bit-efficiency with regard to error control codes, the scalable protocol may organize packets according to their respective transaction types and transmit the organized packets according to a particular order based on their respective transaction types. In conventional protocols, requests may be ordered according to a time at which they have been issued or transmitted. In this case, if the first request involves a high latency and the following request (i.e., second request) involves a low latency, the second request may have to wait for the first request to finish even though it may be completed more quickly than the first request. As a result, the first request may choke the bus. In other words, the first request may prevent the bus from responding to relatively low latency requests, even though the low latency requests may be resolved more quickly than the higher latency requests.

To provide a more efficient manner in which to mix different types of transaction requests within the bus, the scalable protocol may use transaction windows to determine an order in which requests are serviced. A transaction window may be a virtual channel implemented using a virtual address space. Each transaction window may be associated with a respective memory device, such as NAND and DRAM. As such, a single transaction window may be associated with a memory or memories having the same characteristics, such as latency, bandwidth, granularity, persistence, and the like.

Generally, the transaction window may provide information related to a certain set of rules of engagement for each particular transaction. As mentioned above, the transaction window data may specify a a set of lanes of a physical bus (e.g., channels 29) being used to transmit and receive packets for particular transactions. The set of lanes specified by the transaction window may be referred to as a virtual channel accessible to the memory device 14. Using the transaction window data to characterize certain features (e.g., ordering) related to the transmission or reception of packets, the scalable protocol may better manage the transmission of packets between processors.

Figure 4:
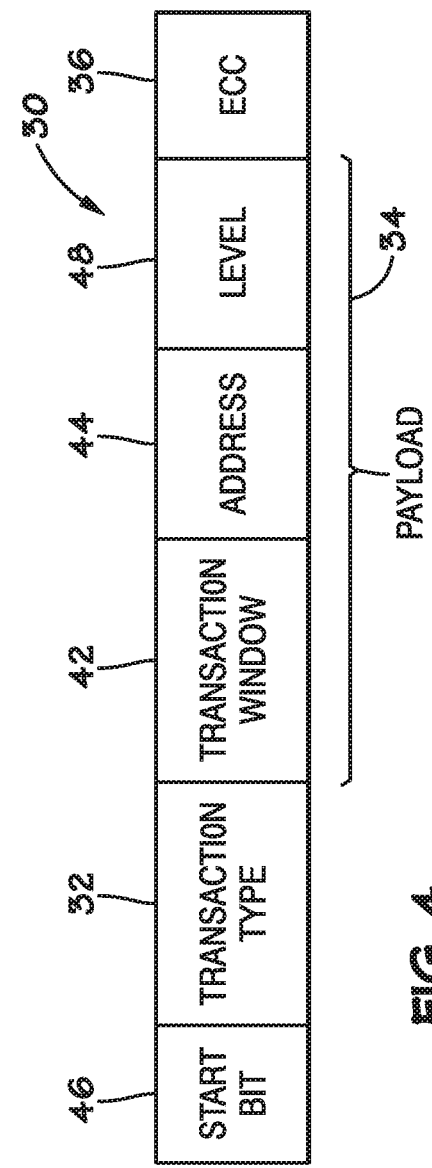
FIG. 4 illustrates a detailed packet level view of the packet that may be transmitted within the computing system of FIG. 1, in accordance with an embodiment.

For instance, since each type of memory device has a different latency, it may be beneficial to manage the flow of bus traffic between various types of memory devices 14 and the host SoC 12 based on respective latencies of the respective memory devices. By way of example, DRAM devices generally have fast latencies (e.g. 50 ns from a random request), while NAND devices generally have slow latencies (e.g. 500 us) with error correction after a random request. SRAM buffers have faster latency of 10 ns. Keeping this in mind, the scalable protocol may designate a transaction window for each memory device. In one embodiment, the scalable protocol may use two fields to designate each transaction window: a 48-bit Address and a 3-bit Window (i.e., addressing Windows 0 through 7). FIG. 4 illustrates a block diagram that depicts the two fields that designate the transaction window in the packet 30. As shown in FIG. 4, a transaction window field 42 and an address window field 44 may be part of the payload field 34. The transaction window field 42 may specify a designated transaction window and the address window field 44 may specify the 48-bit address associated with the specified transaction window. The 48-bit address may be a virtual address assigned to a virtual channel (i.e., window). In one embodiment, the virtual address space may reference a physical address located on a hard disk drive or some other storage device. As such, the memory device may have the ability to store more data than physically available.

In addition to the transaction window field 42 and the address window field 44, the packet may include a start bit 46 and a level of indirection field 48. The start bit 46 may indicate the beginning of a packet. The level of indirection field 48 may be part of the payload field 34 and may provide a value that indicates a number of levels of indirection the respective transaction may include. Additional details regarding the start bit field 46 and the level of indirection field 48 will be discussed in greater detail in other sections below.

Generally, each type of memory device may be assigned to a different transaction window. By way of examples, DRAM0 may be assigned into Window0, DRAM1 into Window1, DRAM2 into Window2, NAND0 into Window3, NAND1 into Window4, and SRAM buffers and control registers into Window7. With this in mind, an example set of transactions may be sent according to the following sequence:

(1) Read.Window0.AddressA
(2) Read.Window3.AddressB
(3) Read.Window0.AddressC
(4) Read.Window0.AddressD
(5) Read.Window0.AddressE
(6) Read.Window0.AddressF
(7) Read.Window3.AddressG
(8) Read.Window0.AddressH
(9) Read.Window0.AddressI As shown above, transactions 1, 3-6, 8, and 9 are part of Window0, which corresponds to a DRAM memory device. Transactions 2 and 7, on the other hand, are part of Window3, which corresponds to a NAND memory device. Upon receiving the above requests, the receiving component may respond to the received requests using ordering rules established according to the respective transaction windows specified for each transaction. As such, the receiving component may use the transaction windows to provide a local ordering protocol between the transmitting component and the receiving component.

In one embodiment, the ordering rules specified for a particular transaction window may be based on the respective latency associated with the respective transaction window. That is, the receiving component may respond to the requests involving lower latencies first before responding to the requests having longer latencies. Since the receiving component may be aware of the latency differences between each transaction window, the receiving component may decide to receive the transactions according to their window designations. As such, referring again to the example transactions described above, the receiving component implementing the scalable protocol may respond to the above requests as follows:

(1) Data.Window0.AddressA
(3) Data.Window0.AddressC
(4) Data.Window0.AddressD
(5) Data.Window0.AddressE
(6) Data.Window0.AddressF (8) Data.Window0.AddressH
(9) Data.Window0.AddressI
(2) Data.Window3.AddressB
(7) Data.Window3.AddressG As shown above, the receiving component may first respond to the low-latency requests of Window0 before responding to the higher latency requests of Window3. That is, the long latency requests may be transmitted later than the short latency requests. As a result, the system bus servicing the requests is not hampered by the presence of different classes of memory on the same bus without adding various elaborate protocol complications, such as adding a field with REQUEST PRIORITY. In this way, the scalable protocol provides a complex system operation using a minimal number of bits in a relatively simple manner.

In another example, the receiving component may employ a local ordering scheme based on a corresponding transaction window specified for each transaction. For the following transaction:

(1) Read8b.Window1.AddressA
(2) Read8b.Window2.AddressB
(3) Read8b.Window1.AddressC The receiving component may first receive transaction (1) and determine whether AddressA is available. If AddressA is busy, the receiving component may store transaction (1) in a queue and wait for AddressA to become available. In the meantime, the receiving component may then receive transaction (2) and perform the read operation if AddressB is available. The receiving component may then receive transaction (3) and since it is associated with the same window as transaction (1), the receiving component may determine whether there are any ordering conflicts with regard to performing transaction (3) before transaction (1) because they are part of the same transaction window. In the same manner, the receiving component may disregard any potential ordering conflict or the determination of any potential ordering conflict with transaction (2) because it is part of a different transaction window. As such, the transaction windows may provide a more efficient way for data operations to be performed while different transactions are being performed. That is, since the transaction windows allow operations to be logically grouped with related operations or memory devices, operations may be performed in a variety of orders, thereby providing a flexible way to complete transactions. In contrast, conventional protocols typically enforce a strict order of data operations to be performed according to the order in which the transactions were sent even though different transactions may be performed in a variety of orders or may process transactions based on the inclusion of priority information sent in a dedicated protocol field.

In one embodiment, the scalable protocol may provide an ability to assign a minimum transaction size for each window (e.g., Window0.Size=8Bytes, Window3.Size=128B). For example, if a minimum transfer size for Window0 is 8 bytes, for a 48b address field, Window0 may store $2^{48}*8$ bytes=~$2.25 \times 10^{15}$ bytes. In the same manner, if a minimum transfer size for Window3 is 128 bytes, Window3 may support ~$3.6 \times 10^{16}$ bytes. As such, both Window0 and Window3 support considerably more bytes than the address space implies.

Another feature associated with the transaction window includes a simple system-level addressability of other spaces such as Window0 SRAM and system control registers without creating additional commands in the protocol. That is, SRAM and system control registers may be addressed by simply using Window0. Prior protocols, on the other hand, may use additional commands such as register.read and register.write to interact with these types of memories. With the designated transaction window for these memory types, the same read and write commands used for other memory devices may also be used for SRAM and system control registers. That is, the read and write commands may simply point to an appropriate window. As such, the scalable protocol may employ fewer commands, thereby reducing the number of bits used in the protocol.

By organizing data transactions according to transaction types, multiple transaction windows may provide multiple avenues of access to the same memory type. For example, a typical DDR3 DRAM may include eight banks, and an internal bus may include eight such DRAMs. With this in mind, the eight DRAMS may be organized such that Window1 represents bank 0 of a group of eight DDR3 DRAMs and Window2 provides access to bank 1 of this same group. In this way, each window may specify a particular virtual address space of each DRAM. With this in mind, it is clear that a number of suitable grouping methods are available since there could be any number of DRAMs grouped in a lock-step operation, each with pages, banks and ranks. In the same manner, NANDs may also be grouped with pages, planes, and blocks. Furthermore, multichannel devices can be further separated per channel and various aggregations thereof. Generally, the grouping options may be determined based on a complexity of logic chip design.

By supporting multiple transaction windows having multiple virtual address spaces and virtual channels, the scalable protocol may use the transaction windows to establish predictable data ordering in a system that contains memories that have different latencies. As a result, the scalable protocol may support high and low priority requests without having an explicit protocol field that specified how the high and low priority requests are ordered.

Figure 5:
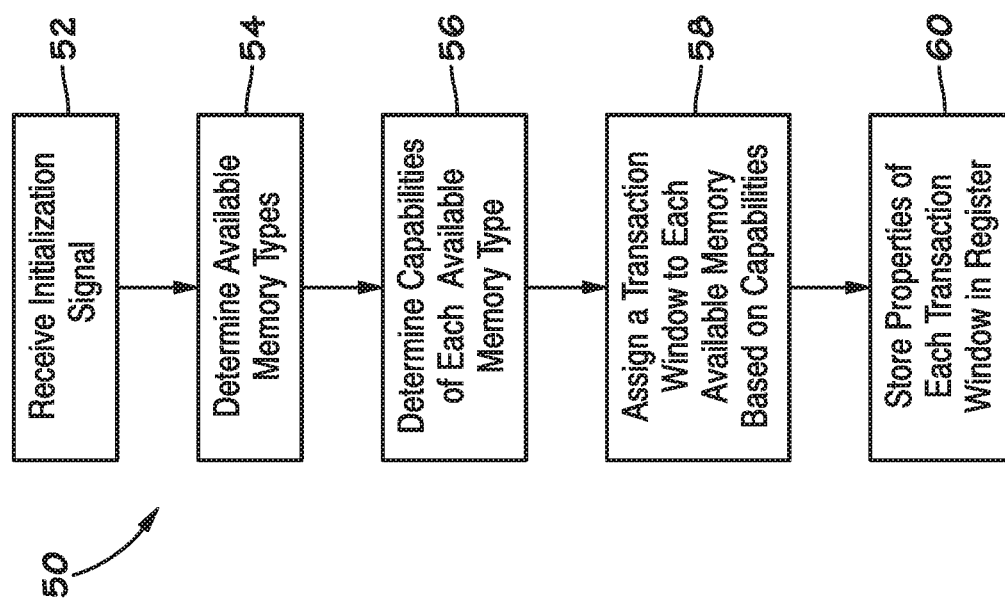
FIG. 5 illustrates a flow chart of a method for assigning transaction windows for various types of memories that are part of the memory device of FIG. 2, in accordance with an embodiment.

With the foregoing in mind, FIG. 5 illustrates a flow chart of a method 50 for assigning transaction windows for various types of memories that are part of the memory device 14. Although the method 50 is depicted in a particular order, it should be noted that the method 50 may be performed in any suitable order, and thus, is not limited to the order depicted in the figure. Additionally, the following description of the method 50 will be described as being performed by the memory SoC 22 for discussion purposes. As such, any suitable processor that is communicatively coupled to various types of memories may perform the operations described in the method 50.

Referring now to FIG. 5, at block 52, the memory SoC 22 may receive an initialization signal from registers or other memory components stored within the memory SoC 22 itself. In one embodiment, the initialization signal may be received by the memory SoC 22 upon power up or when the memory device 14 initially receives power.

At block 54, the memory SoC 22 may determine the memory types that it may be able to access. That is, the memory SoC 22 may scan its communication lanes (e.g., channels 29) and identify the different types of memories that may be communicatively coupled to the memory SoC 22. Referring back to the example memory device 14 depicted in FIG. 2, the memory SoC 22 may determine that the RLDRAM 26, the DDR4 28, and the NAND 24 memory types are coupled to the memory SoC 22.

At block 56, the memory SoC 22 may determine the capabilities of each of the memory types identified at block 54. The capabilities of the memory types may include a capacity of the memory type, an expected latency for a read operation using the memory type, an expected latency for a write operation using the memory type, and the like. Other capabilities that may be identified by the memory SoC 22 for use in assigning transaction windows may include read latency, write latency, bandwidth, minimum read transaction size, minimum write transaction size, device cycle time, writeable in place or not, byte write capability or not, and the like. In certain embodiments, each different type of memory may be associated with a different set of capabilities. The associations between the different types of memories and the different sets of capabilities may be stored in a register of the memory SoC 22 or may be provided by each respective memory type.

After determining the capabilities of the memory types, the memory SoC 22 may, at block 58, assign a transaction window to each memory type identified at block 54 based on the respective capabilities of each memory type. Generally, the memory SoC 22 may assign each similar memory type to the same transaction window. That is, since each similar memory type has similar capabilities, the memory SoC 22 may assign the memory type to the same transaction window. For example, referring again to the example memory device 14 of FIG. 2, the memory SoC 22 may assign the two DDR4 28 memories to the same transaction window because they are identical memory types. In the same manner, if two different memory types have a certain number of similar capabilities, the memory SoC 22 may also assign the two memory types to the same transaction window.

In one embodiment, the memory SoC 22 may assign a memory type to a corresponding transaction window based on desired operations of the memory SoC 22. For instance, if the memory SoC 22 desires that all read operations have at least a particular latency, the memory SoC 22 may assign each identified memory type into a first transaction window that meets this latency threshold or into a second transaction window that does not meet this latency threshold.

After assigning a transaction window to each identified memory type, the memory SoC 22 may proceed to block 60 store properties of each transaction window in a storage device. The storage device may include any suitable device capable of storing data. As such, the storage device may include a local register, a table, or some other information storage unit. In this way, the memory SoC 22 may perform operations for each memory type according to ordering rules as described above. In some cases, the stored properties may detail certain capabilities of each transaction window along with other relevant information regarding the operation of each transaction window.

Transaction Window for Specialized Functions

To provide a more efficient manner in which to mix different types of transaction requests within the bus, the memory SoC 22 or any other suitable processor may use transaction windows to determine an order in which requests are serviced. As discussed above, since each type of memory device has a different latency, it may be beneficial to manage the flow of bus traffic between various types of memory devices 14 and the host SoC 12 based on respective latencies of the respective memory devices.

For example, as detailed above, the transaction window may provide information to the receiving component to organize the manner in which it responds to received requests. Specifically, the receiving component may first respond to the low-latency requests of Window0 before responding to the higher latency requests of Window3. As such, the long latency requests may be transmitted after the short latency requests, and the system bus servicing the requests is not hampered by the presence of a long latency request preventing a short latency request from being performed.

In one embodiment, the scalable protocol may also provide an ability to assign a minimum transaction size for each window (e.g., Window0.Size=8Bytes, Window3.Size=128B). For example, if a minimum transfer size for Window0 is 8 bytes, for a 48b address field, Window0 may store $2^{48}*8$ bytes=~$2.25 \times 10^{15}$ bytes. In the same manner, if a minimum transfer size for Window3 is 128 bytes, Window3 may support $3.6 \times 10^{16}$ bytes. As such, both Window0 and Window3 support considerably more bytes than the address space implies.

Another feature associated with the transaction window may include a simple system-level addressability of other spaces such as Window0 SRAM and system control registers without creating additional commands in the protocol. That is, SRAM and system control registers may be addressed by simply using Window0. Other protocols, on the other hand, may use additional commands such as register.read and register.write to interact with these types of memories. With the designated transaction window for these memory types, the same read and write commands used for other memory devices may also be used for SRAM and system control registers. That is, the read and write commands may simply point to an appropriate window. As such, the scalable protocol may employ fewer commands, thereby reducing the number of bits used in the protocol.

Keeping the foregoing in mind, transaction windows can be seen as being associated with different memory devices 14. In one embodiment, each memory device 14 may be associated with at least two transaction windows, one of which being Window0. Window0 may include a logical space in which all special or complex functions capable of being performed by the respective memory device 14 may be implemented. For example, Window0 may be part of control registers, buffers, SRAM cache, general SRAM, and the like. As such, complex functions that may be relatively complicated to easily represent in any protocol may be enabled within the transaction Window0 of the respective device. That is, the scalable protocol may perform the relatively simple transaction type operations mentioned above (e.g., read, write, RMW, etc.) without creating additional transaction types to perform different types of complex functions.

In addition to providing a logical space in which all special or complex functions capable of being performed by the respective memory device 14 may be implemented, Window0 may serve as a consistent location in which other devices may consult to determine the respective capabilities of the respective device. That is, other devices may access Window0 of a respective device to discover the type of device they may be connected to, the capabilities of the respective device, what items may be programmable in the respective device, various characteristics pertaining to the respective device, and the like.

Moreover, since the scalable protocol is designed to enable an abstracted memory system, devices using the scalable protocol may perform relatively simple operations without conforming or modifying its commands based on the respective device they may be connecting with. However, if the other devices desire to perform other operations that may be part of the known transaction types, the other devices may access Window0 to determine how the other operations may be performed. As such, Window0 may store specific algorithms or functions that may be performed by the respective device and may not be broadly applicable to all memory devices. By employing Window0 for each respective device as discussed above, various types of complex operations may be performed by various devices without transmitting numerous messages and transaction operations between two devices to enable one device to perform the complex operations.

Figure 6:
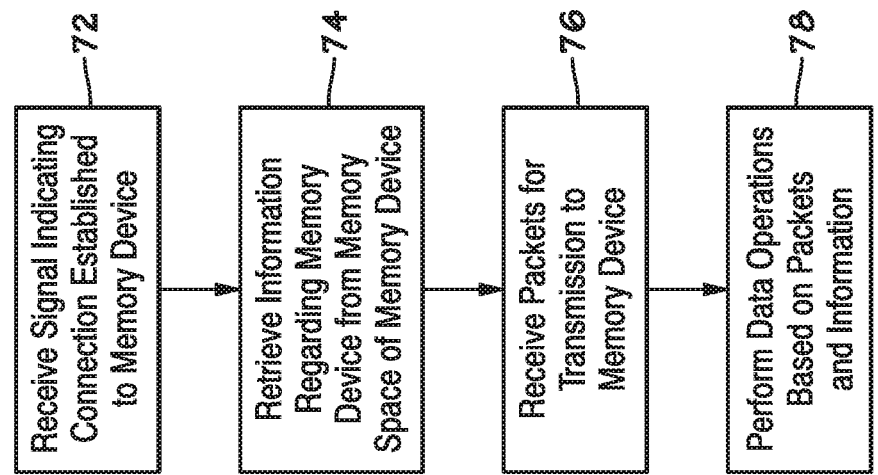
FIG. 6 illustrates a flow chart of a method for performing specialized operations on a memory device, which may be part of the computing system of FIG. 1, in accordance with an embodiment.

FIG. 6 illustrates a flow chart of a method 70 for performing specialized operations using the memory device 14. In certain embodiments, the method 70 may be performed by the memory SoC 22, but it should be understood that any suitable processing device capable of communicatively coupling with a memory component may perform the method 70.

Referring first to block 72, the memory SoC 22 may receive a signal indicating that a communication connection (e.g., electrical, optical) with the memory device 14 has been established. The signal may be received upon power up of the memory device 14.

At block 74, the memory SoC 22 may retrieve information regarding the memory device 14 from a pre-defined memory space (e.g., Window0). That is, every type of memory device 14 that employs the scalable protocol may include a pre-defined memory address that may store Window0 information discussed above. As such, the memory SoC 22 may acquire information regarding the memory device 14 including, for example, memory space in the memory device 14 where the memory device 14 may perform various functions, capabilities of the memory device 14, various algorithms or functions that may be performed by the memory device 14, and the like.

After obtaining information pertaining to the memory device 14, at block 76, the memory SoC 22 may receive packets of data from the host SoC 12 or some other device coupled to the memory device 14. The packets of data may include various types of data operations, such as read, write, message, and the like. In some embodiments, the data operation may include a complex or special function that the information acquired at block 74 indicates may be performed by the memory device 14. In this case, the memory SoC 22 may receive these packets and use the dedicated memory space to perform the operations, to apply algorithms or functions as specified by the operations, or the like.

For example, a Processor-in-Memory (PIM) style device may include very little intelligence and may have a large sequence of control information communicated to control silicon within the PIM from the host SoC 12, the memory SoC 22, or any other suitable processor. Control silicon may include a processor or some other circuit used to control an electronic device such as a PIM. The control information may include relatively simple operations that may be performed by the PIM. For instance, the control information may instruct the PIM to perform a vector compare of vector A versus vector B, which would require a relatively small amount of control flow information. The vector operation may correspond to a SIMD (single instruction, multiple data) function that performs a bit-by-bit compare of 64K bits versus another 64K bits, producing a 64K bit answer of 1 for every location that matches and 0 for every bit location that does not match.

The control information may include more complex functions, such as an operation that may include performing a vector addition of 32-bit integers. To perform this operation, the PIM may use a high cycle count of events, which may be controlled by a stream of control information. In the same manner, the control information may include more complex functions, such as performing a double-precision 64-bit floating-point math function such as $(a+jb)*(c+jd)=e+jf$ for a vector. In this example, $e=a*c-b*d$, $f=a*d+b*c$. To perform this operation, the PIM may use floating point normalizations, proper exponents in results, and an array of operands in SIMD fashion. Examples of even more complex operations include performing an H.264 decode of a video stream by performing millions of individual operations, each of which themselves may employ numerous control cycles in the PIM.

Regardless of the complexity of the operation being performed, at block 78, the memory SoC 22 may perform the data operations specified in the packets based on the information retrieved at block 74. That is, referring to the examples discussed above, the memory SoC 22 may perform any type of operation using simple protocol commands and the data available in Window0 of a respective device. For instance, with regard to the example of the simple operation of the vector bit-by-bit compare operation discussed above, the component performing the operation may employ just a few cycles of control information and then the entire sequence may be exported from the component (e.g., memory SoC 22), which physically houses the Window0 control registers may be utilized, buffers, etc., to the silicon device which housed the PIM hardware. If the vector bit-by-bit compare operation may be communicated using just 256 bits of control information, a single write command (e.g., 32uWrite-write 32 units of data where unit is 8 bits) that may write 32 bits to an appropriate Window0 control register. A SoC which supports the PIM may be designed such that it has translation hardware to send information from the control register to the PIM device using a native protocol of the PIM device which may be different than the scalable protocol described herein. Here, the vector compare operation may also have been simply directly addressed to a particular address of the PIM itself if the PIM has an addressable control register to perform such an operation.

Considering the more complex example of performing a vector addition of 32-bit integers, this operation may entail some small number of cycles for a single bit (e.g., 6 control cycles). However, when increasing the data size to 32 bits, the operation can be regarded as 32× those 6 control cycles and even more when considering that additional shifting may be involved. In this case, the whole control sequence may be built up in window0 of the SoC. Once a first portion of the control sequence is ready, the first portion of the control sequence may be sent to the PIM. In the same manner, once the second portion of the control sequence is ready, the second portion of the control sequence may be sent to the PIM. This process may continue until the whole function is complete.

In certain embodiments, the control sequence may be constructed within Window0 in a variety of ways. For example, to provide an efficient way in terms of involving a least amount of data flow, the control sequence may be constructed using a direct memory access (DMA) method of building a macro. An example individual DMA transfer may be as follows: RMW2A, 1 KB of data, from Window.2 Address xyz to Window.0 Address abc. In this way, primitive commands, such as compare, add, multiply, etc., may be stored in non-volatile memory which may reside in the same transaction window (e.g., if embedded NOR Flash was used in the SoC) or in a different transaction window (e.g., if NAND FLASH accessible to the SoC was used). In one embodiment, a more complex macro may be simply built by performing a DMA transfer of a smaller macro from the nonvolatile device and piecing together the large complex macro from a number of small macros in the appropriate order. Here, when the macro is completely assembled, piece-meal parts of an instruction stream may be sent to the PIM device for execution.

Scalable Error Control Code

In addition to the features described above, various aspects of the scalable protocol are aided by the successful implementation of an Error Control Code. However, to send bit-efficient packets of data, the scalable protocol may implement an error control code for error detection that is scalable based on a data length of a corresponding payload field 34 of the packet 30. That is, in one embodiment, the scalable protocol may use a small number of parity bits (P-bits) to cover short data lengths and a progressively larger number of P-bits as the data length increases. Generally, the relationship between the data length covered and the number of P-bits employed corresponds to a best possible cyclic redundancy check (CRC) code for any given data length. Scaling the number of P-bits used based on the size of the data length may be employed with various types of memory technologies that have a bus used for information communication, such as DRAM, NAND, emerging memory, controllers, and the like.

In one embodiment, in contrast to conventional solid-state devices, which may have an absolute requirement of number of bits used for correction and detection of errors, the scalable protocol may switch between various levels of error code detection based on whether the data being verified has an acceptable amount of errors. That is, the scalable protocol may initially use a less-computationally intensive error control code to determine whether the data being verified has an acceptable amount of errors. Upon detecting that the data includes errors above some threshold, the scalable protocol may include using a more-computationally intensive error control code to determine the errors of the data.

To check the errors of a corresponding payload while incorporating a scalable or dynamically sized ECC field, the scalable protocol may implement an error control code algorithm having a Hamming Distance of 3 (HD3), 4 (HD4), 5 (HD5), 6 (HD6), or the like. In any case, the size of the error control code implementing the Hamming Distance algorithm may change based on the size of the payload in the packet. As such, the transaction type field 32 may specify a certain number of bits in the error control code, such that the number of bits specified may be directly related to the number of bits in the payload of the packet. By enabling the ECC to be dynamically sized within the packet, the scalable protocol may further increase the bit efficiency with respect to each data transfer or transaction. In other words, since the integrity of a relatively small data payload may be verified using a relatively small ECC field, it may be inefficient to use a larger ECC field to verify the integrity of the corresponding data payload.

Keeping this in mind, the HD3 error control code may detect any 1-bit or 2-bit errors. The HD3 code may also have a high probability of detecting any 3-bit errors but the detection of a 3-bit error is not guaranteed. In one embodiment, the HD3 error control code may be applicable for code of an infinite data length. In one example of implementing the HD3 error control code in hardware via a collection of XOR gates, for data bit #1, the value may be 3 or binary 00 . . . 0011. Here, the least significant bit is the rightmost bit. A "1" in that bit location means that a Parity bit 0 may use an XOR term from data bit 1. The next leftmost bit may also be a "1," which indicates that Parity bit 1 may use an XOR term from data bit #1. Since there are no more entries that are 2 P-bits long, the P-bit count may increase by 1. In the same manner, if data bit #2 has a value of 5, or binary 0 . . . 0101, an XOR term from data bit #2 may be used for the following P-bit numbers 0 and 2. For data bit #3 having a value of 6 or binary 0 . . . 0110, an XOR term from data bit #3 may be used for P-bit numbers 1 and 2. For data bit #4 having a value of 7 or binary 0 . . . 0111, an XOR term from data bit 4 may be used for P-bit numbers 1, 2 and 3. As shown in this example, the number of P-bits increases as the data bit value increases. Keeping this in mind, Table 1 below summarizes how the number of P-bits increases according to the data length of the payload field for the HD3 error control code.

TABLE 1

| Data Length | No. of P-bits |
|---|---|
| 1 | 2 |
| 4 | 3 |
| 11 | 4 |
| 26 | 5 |
| 57 | 6 |
| 120 | 7 |
| 247 | 8 |
| 502 | 9 |
| 1013 | 10 |
| 2036 | 11 |
| 4083 | 12 |
| 8178 | 13 |
| 16369 | 14 |
| 32752 | 15 |
| 65519 | 16 |
| $2^n - n - 1$ | n |

Like the HD3 error control code, an HD4 error control code may also use a scalable number of P-bits based on the size of the data payload in the packet. This HD4 error control code may detect all 1-bit, 2-bit and 3-bit errors in a data payload and may fail to detect a small percentage of errors of 4-bits and higher.

In an example of implementing the HD4 error control code in hardware via a collection of XOR gates, for data bit #1, the value may be 7 or binary 00 . . . 00111. Here, a "1" in that bit location of the least significant bit means that a Parity bit 0 may use an XOR term from data bit 1. The next leftmost bit may also be a "1," which indicates that Parity bit 1 may use an XOR term from data bit #1. Since the next leftmost bit may also be a "1," the Parity bit 2 may use an XOR term from data bit #1. At this point, the P-bit count may increase by 1 when there are no more entries that are 2 P-bits long.

If data bit #2 has a value of 11, or binary 0 . . . 1101, an XOR term from data bit #2 may be used for the following P-bit numbers 0, 2, and 3. For data bit #3 having a value of 13 or binary 0 . . . 1110, an XOR term from data bit #3 may be used for P-bit numbers 0, 2, and 3. For data bit #4 having a value of 14 or binary 0 . . . 1110, an XOR term from data bit 4 may be used for P-bit numbers 1, 2 and 3. As shown in this example, the number of P-bits increases as the data bit value increases. Keeping this in mind, Table 2 below summarizes how the number of P-bits increases according to the data length of the payload field for the HD4 error control code.

TABLE 2

| Data Length | No. of P-bits |
|---|---|
| 1 | 3 |
| 4 | 4 |
| 11 | 5 |

TABLE 2-continued

| Data Length | No. of P-bits |
|---|---|
| 26 | 6 |
| 57 | 7 |
| 120 | 8 |
| 247 | 9 |
| 502 | 10 |
| 1013 | 11 |
| 2036 | 12 |
| 4083 | 13 |
| 8178 | 14 |
| 16369 | 15 |
| 32752 | 16 |
| $2^{(n-1)} - n$ | n |

As shown in the tables above, the data length supported is generally a longer data length than a possible CRC code of the same P-bit count. Moreover, regardless of whether an HD3 error control code, an HD4 error control code, HD5 error control code, etc. is employed by the scalable protocol, since the size of the ECC field varies based on the size of the data payload, the scalable protocol may enable a more bit-efficient transfer of packets as compared to conventional protocols.

In certain embodiments, when sending packets to the host SoC 12, the memory SoC 22 may generate an error control code based on the size of the payload being transmitted. That is, the memory SoC 22 may receive a packet to be transmitted to a host SoC 12. The memory SoC 22 may then determine a size of the ECC field 36 based on a size of the payload being transmitted in the packet. As such, after determining the size of the packet, the memory SoC 22 may identify an appropriate ECC algorithm to use to encode the packet. The memory SoC 22 may then encode the packet using the identified ECC algorithm and then send the encoded packet to the host SoC 12.

System Window

In a computer system that has multiple host processors and multiple memory modules that communicate with each other, it may be difficult to determine which host processor is communicating with which memory module. In conventional protocols, each host processor and memory module may listen to each communication between the host processors and the memory modules to determine whether a respective communication is associated with it. However, listening to each communication between host processors and memory modules may be an inefficient way to identify communications.

To provide a more efficient way to identify communications that may be related to a particular device, the scalable protocol may include assigning a specific identification (ID) or system window (e.g., SysWin0, SysWin1, SysWin2, etc.) for each piece of control silicon (e.g., host processor, memory ASIC, etc.) in a system. The system window may be similar to the transaction window in that it may be a virtual channel implemented using a virtual address space. The system window may include a source field (e.g., sourceSysWin) and a destination field (e.g., destinationSysWin) that may indicate a source of a respective communication and a destination of the respective communication. As such, when communicating with other devices, a transmitting component may append the transaction operation or communication with an appropriate system window to indicate the destination of the communication.

Keeping this in mind, the scalable protocol may use system windows (or a system window) to create a globally-enabled, fully-distributed memory management unit (MMU). The MMU may protect the memory device 14 from other components accessing certain information in the respective memory device 14. The MMU may also provide a mapping between virtual memory space and actual memory space. By incorporating the system windows into each communication between various host processors and memory modules, the scalable protocol may enable a global MMU system by allowing each respective memory device to locally manage communications at a system window level. That is, the ASIC of each memory device may enforce any local rules associated with the respective memory device based on the system window associated with a received communication. As such, by assigning each communication with a particular system window to indicate a respective control silicon associated therewith, the scalable protocol may enable a global memory management unit (MMU) that locally manages access to each respective memory device 14.

In this manner, system windows may be added to the scalable protocol to enable various types of capabilities to the overall system. From the scalable protocol perspective, as mentioned above, the system window may include two fields: sourceSysWin and destinationSysWin, which may enable global routing of packets in large systems.

In addition to the global routing features, the system window enables the scalable protocol to combine aspects of the systems windows, transaction windows, channels, and a security method to create a global memory management unit. For instance, a security model for each memory device may be extended to a multi-SoC system and thus may enable a distributed global memory management scheme within the multi-SoC system and distributed global memory security for the multi-SoC system.

As mentioned above, the system window (SysWin) may be a global address for a SoC (e.g., host SoC 12 and memory SoC 22) residing in a system. The transaction window may be, in a memory context, a portal to a region of memory that may be associated with multiple entire memory devices or as small as a single page of a memory device. The channel may refer to a physical full duplex bus that attaches the SoC to other SoCs in the system.

In certain embodiments, the channel and transaction window (CHANNNEL.WINDOW) may be associated with a secure zone that may prevent unauthorized access by putting a protection gatekeeper at the entrance to the memory data. The security zone may be a combination of a physical channel (e.g., CHANNEL) and a transaction window (e.g., WINDOW) accessed through that channel. In a small system, where there is a host system-on-chip (SoC) and a memory subsystem accessed through a Memory Module (MM) SoC, the SoCs are generally constructed in a fixed topology. That is, the SoCs may be soldered down on a printed circuit board, such that the buses are wired and do not change physical interconnections. As a result, just the established entities of the SoCs may communicate on those buses for normal operation.

To provide security features for the memory data, an access list may be established for each security zone. For instance, the host and the MM SoCs may have within them a stored key. The access list in the MM SoC may initially be empty. At power-on, a handshake may occur to fulfill a desire of the host SoC to gain access to data held downstream of the MM SoC. As such, the host SoC may send a message to the MM SoC to add an item to the access list. The message may include a code generated from a mutually known polynomial function of the stored key and a particular chunk of data known to both the host SoC and the MM SoC. Thus, the stored key may not be available for the bus to access. This code may be verified by the MM SoC, and, if valid, the MM SoC may allow the item to be added to the access list of the MM SoC. For example, if the system has 2 physical channels named 0 and 1 and the MM SoC is configured to have 1024 Windows, 0 through 1023, the host SoC may want Windows 0 through 27 to be accessible through channel 0 and Windows 28 through 1023 accessible through channel 1. Here, the host SoC may make access requests for each of these windows by sending messages including a single or multiple operations to add to access lists.

The message may be sent using write, Read-Modify-Write, or message packets. That is, any of these types of packets may be used to make the request to add an item to the access list.

In certain embodiments, requests may also be made to remove entries from the access list. That is, at some time, access may no longer be desired. As such, for security, the host SoC may request that entries are removed by following the same procedure of using the code in the message for removing an entry.

As a result of the method described above with respect to security zones, a level of protection against errant software, particularly where the channel count and window counts are high, may be provided. For example, if a particular software thread when running normally is provided access to just the data in Window 17 through channel 0, the MM SoC may recognize that any authorized element for a request should be coming on channel 0 for Window 17. Since any other request on that channel is unauthorized, the memory behind the other windows may thus be protected from reads or writes.

Another advantage of implementing the security zone includes providing security against malicious threats. For instance, if the host SoC is unsoldered and an attacker tries to probe the memories behind the MM SoC, the attacker still may not be able to access anything even if they know the correct protocol because they do not have the stored key. As such, when the system is powered on, the attacker still does not know how to add anything to the access list, and any access request by the attacker will be denied.

Moreover, by providing security zones, the function of a CPU Memory Management Unit may be replaced. Using an example of an ARM processor, a MMU may have a page size selectable as 4 KB or 64 KB. Assuming that all pages are 4 KB and that a grain size (i.e., minimum operation size) of the window is 8B, the address within a page may be 9 bits. Assuming now that the system capacity is 16 GB of physical memory, the window field may be at least 18 bits (actually 19 because there may be a window0 for control registry, buffers, etc). Using 2^18 windows to access the memory with 4 KB of memory residing in each window, a 1 for 1 mapping of virtual memory to physical memory may exist. As a result, a system that can provide access security to the physical memory may be achieved. If the window count is increased further, security to virtual memory may then be supported. That is, each 4 KB chunk of physical memory may be mapped into more than 1 window.

Keeping the discussion of security zones in mind, the system window (SysWin) may extend the security features described above to a multi-SoC system to enable distributed global memory management for the multi-SoC system and distributed global memory security for the multi-SoC system. That is, when multiple SoCs are present in the system, the security zones described above may not adequately provide security for each SoC because the above-described security zones may rely on a presence of a single host SoC. It should be noted that the above-described security zones may function correctly with multiple MM SoCs so long as no packet forwarding occurs between those multiple MM SoCs. However, when this is not the case, the communications may become less secure.

By adding the sourceSysWin and destinationSysWin fields in the protocol, the security zones' capabilities may be extended to systems having multiple SoCs. That is, in one embodiment, the security zone may change from CHANNEL.WINDOW to CHANNEL.SYSWIN.WINDOW. The secure access list may then reflect the added field. In this larger system with multiple SoCs, the same benefits of the security zones described above are present, but extended to systems of any size. Thus, creating the ability to have globally enforced security and global scope but locally executed memory management and protection.

Figure 7:
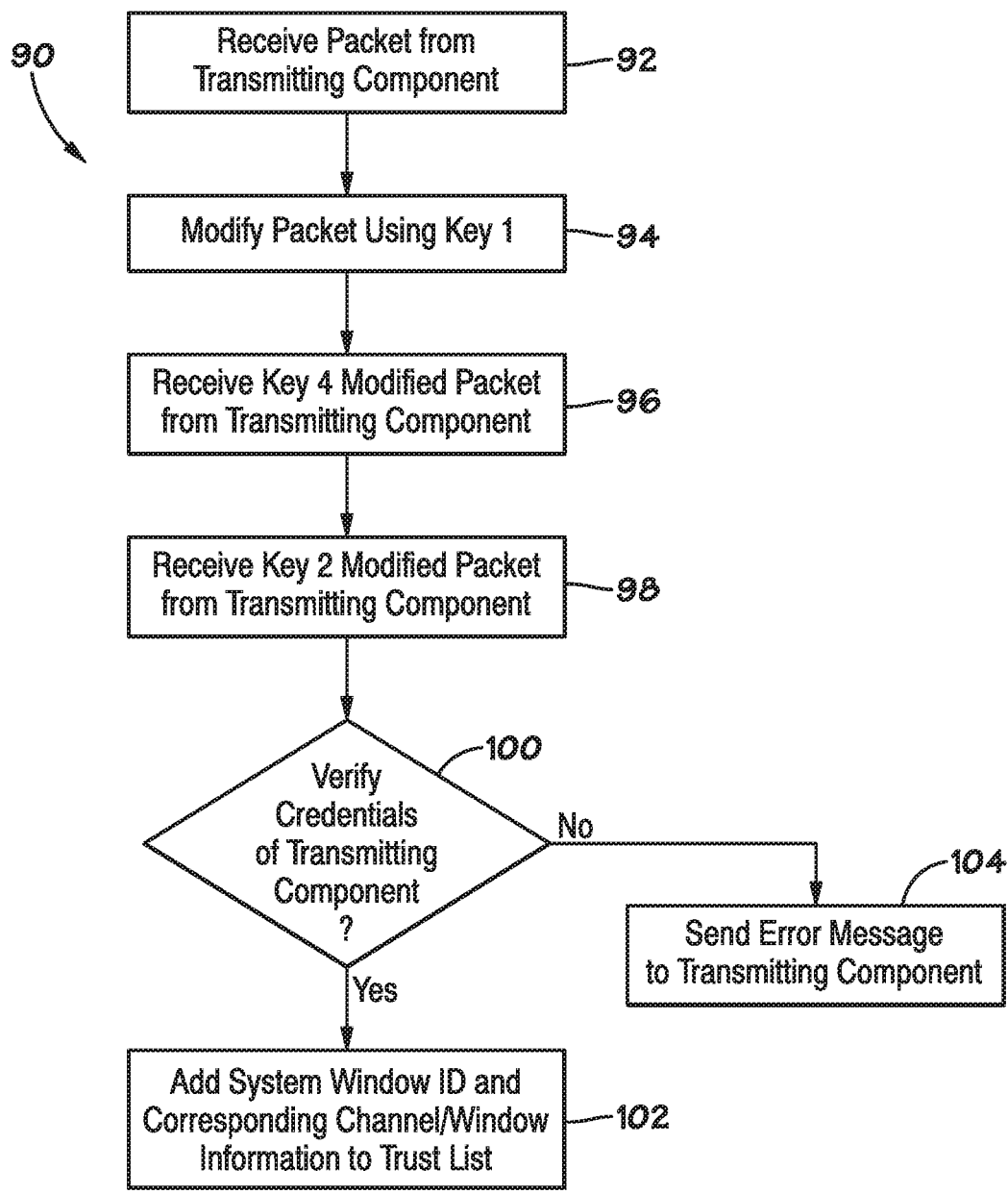
FIG. 7 illustrates a flow chart of a method for generating a secure access list of trusted components, in accordance with an embodiment.

Keeping the foregoing in mind, FIG. 7 illustrates a flow chart of a method 90 for generating a secure access list of trusted components. The following description of the method 90 will be described as being performed by the memory SoC 22, but it should be understood that any suitable processor may perform the method 90.

Referring now to FIG. 7, at block 92, the memory SoC 22 may receive a packet from a transmitting component (e.g., host SoC 12). In one embodiment, the packet may be the first packet received from the transmitting component by the memory SoC 22. As such, the memory SoC 22 may not know whether to trust packets received from the transmitting component or not.

Upon receiving the packet, at block 94, the memory SoC 22 may modify the packet using a first key (e.g., key 1). In certain embodiments, each transmitting and receiving component operating using the scalable protocol described herein may have encryption keys stored thereon to determine whether the respective component is authorized to perform a data operation associated with a packet. Since the keys are stored on each respective component, the key cannot be intercepted via transmission. That is, the trust zone established using the keys described herein is created from end nodes, and thus provide a secure zone.

After modifying the packet with the first key, at block 96, the memory SoC 22 may transmit the packet modified using the first key back to the transmitting component. The transmitting component may again modify the packet modified using the first key. That is, the transmitting component may modify the key 1 modified packet using a second key (e.g., key 2). After modifying the key 1 modified packet, the transmitting component may send the key 2 modified packet back to the memory SoC 22.

At block 98, the memory SoC 22 may receive the key 2 modified packet from the transmitting component. If the transmitting component is a trusted component operating within the scalable protocol, the key (e.g., key 2) used to modify the key 1 modified packet should create some result that the memory SoC 22 will recognize as valid. As such, at block 100, the memory SoC 22 may verify whether the transmitting component is trustworthy or has credentials establishing the component as a trustworthy component based on the key 2 modified packet.

If the transmitting component is determined to be trustworthy, the memory SoC 22 may proceed to block 102 and add the system window identification of the packet or the transmitting component to a trusted list stored locally with respect to the memory SoC 22. As such, the memory SoC 22 allows packets from the transmitting component received via a particular channel and having a particular transaction or system window to be received. If the transmitting component is determined not to be trustworthy, an error message may be sent to the transmitting component at block 104. In this way, the hardware of the memory device 14 may be used to provide some security protection with respect to the transmission of packets.

While the embodiments described herein may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system, comprising:
a memory device comprising a processor; and
a first component, configured to:
receive a packet associated with a data operation to send to the processor from a second component, wherein the packet comprises:
a transaction type field comprising an indication of a size of the packet;
a payload field comprising a payload; and
an error control code field comprising an error control code configured to verify an authenticity of the payload;
determine a type of error control code algorithm to employ based on the size of the packet; and
decode the packet based on the type of error control code algorithm.

2. The system of claim 1, wherein the first component is configured to:
determine a number of expected errors associated with the size of the packet; and
identify the type of error control algorithm based on the number of expected errors.

3. The system of claim 1, wherein the size of the packet is directly proportional to an additional size of the payload.

4. The system of claim 1, wherein the type of error control algorithm comprises a Hamming Distance 3 (HD3) error control code, a Hamming Distance 4 (HD4) error control code, a Hamming Distance 5 (HD5) error control code, a Hamming Distance 6 (HD6) error control code, a Hamming Distance 7 (HD7) error control code, or a Hamming Distance 8 (HD8) error control code.

5. The system of claim 4, wherein the HD3 error control code is configured to detect every 1-bit error and 2-bit error in the payload.

6. The system of claim 4, wherein the HD4 error control code is configured to detect every 1-bit error, 2-bit error, and 3-bit error in the payload.

7. The system of claim 4, wherein the HD5 error control code is configured to detect every 1-bit error, 2-bit error, 3-bit error, and 4-bit error in the payload.

8. The system of claim 4, wherein the HD6 error control code is configured to detect every 1-bit error, 2-bit error, 3-bit error, 4-bit error, and 5-bit error in the payload.

9. The system of claim 4, wherein the HD7 error control code is configured to detect every 1-bit error, 2-bit error, 3-bit error, 4-bit error, 5-bit error, and 6-bit error in the payload.

10. The system of claim 4, wherein the HD8 error control code is configured to detect every 1-bit error, 2-bit error, 3-bit error, 4-bit error, 5-bit error, 6-bit error, and 7-bit error in the payload.

11. A method, comprising:
receiving, via a processor, a packet associated with a data operation, wherein the packet comprises:
a transaction type field comprising an indication of a size of the packet;
a payload field comprising a payload; and
an error control code field comprising an error control code configured to verify an authenticity of the payload;
dynamically determining, via the processor, a type of error control code algorithm to employ based on the size of the packet; and
decoding, via the processor, the packet based on the type of error control code algorithm.

12. The method of claim 11, wherein the type of error control code algorithm is determined by:
determining an expected number of errors associated with the size of the packet; and
identifying the type of error control algorithm based on the expected number of errors.

13. The method of claim 11, wherein decoding the packet comprises evaluating the packet via a plurality of XOR gates.

14. The method of claim 11, wherein the packet is encoded prior to being received via the processor, and wherein the payload is encoded based on a size of the payload field.

15. A tangible, non-transitory, machine-readable medium, comprising computer-executable instructions configured to cause a processor to perform operations comprising:
receiving a packet associated with a data operation, wherein the packet comprises:
a transaction type field comprising an indication of a size of the packet;
a payload field comprising a payload; and
an error control code field comprising an error control code configured to verify an authenticity of the payload;
determining a type of error control code algorithm to employ based on the size of the packet; and
decoding the packet based on the type of error control code algorithm.

16. The tangible, non-transitory, machine-readable medium of claim 15, wherein the computer-executable instructions are further configured to cause the processor to perform the operations comprising:
determining an expected number of errors associated with the size of the packet; and
identifying the type of error control algorithm based on the number of errors.

17. The tangible, non-transitory, machine-readable medium of claim 15, wherein the error control code field comprises an additional number of parity bits that corresponds to a cyclic redundancy check (CRC) code.

18. The tangible, non-transitory, machine-readable medium of claim 15, wherein the type of error control algorithm is selected from a plurality of types of error control code algorithms, and wherein each type of error control code algorithm of the plurality of types of error control code algorithms corresponds to a degree of a computationally intensive error control code.

19. The tangible, non-transitory, machine-readable medium of claim 15, wherein the computer-executable instructions for determining the type of error control code algorithm are configured to cause the processor to perform further operations comprising:

detecting a number of errors associated with decoding the packet; and identifying the type of error control algorithm based on the number of errors.

20. The method of claim 11, wherein the error control code field comprises an additional number of parity bits that corresponds to a cyclic redundancy check (CRC) code.

* * * * *